(12) United States Patent
Wang et al.

(10) Patent No.: US 10,630,303 B1
(45) Date of Patent: Apr. 21, 2020

(54) DIGITAL-TO-ANALOG CONVERSION DEVICE AND COMPENSATION CIRCUIT

(71) Applicants: Global Unichip Corporation, Hsinchu (TW); Taiwan Semiconductor Manufacturing Co., Ltd., Hsinchu (TW)

(72) Inventors: Ting-Hao Wang, Hsinchu (TW); Po-Chen Lee, Hsinchu (TW)

(73) Assignees: Global Unichip Corporation, Hsinchu (TW); Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/548,810

(22) Filed: Aug. 22, 2019

(30) Foreign Application Priority Data

Jul. 4, 2019 (TW) .............................. 108123601 A (51) Int. Cl.
*H03M 1/06* (2006.01)
*H03M 1/66* (2006.01)
*H03M 1/78* (2006.01)

(52) U.S. Cl.
CPC ............... *H03M 1/06* (2013.01); *H03M 1/66* (2013.01); *H03M 1/785* (2013.01)

(58) Field of Classification Search
CPC ........... H03M 1/785; H03M 1/66; H03M 1/06
USPC .................................. 341/154, 118, 144, 153
See application file for complete search history.

(56) References Cited

U.S. PATENT DOCUMENTS 5,668,553 A * 9/1997 Ashe ..................... H03M 1/002
341/144

* cited by examiner

*Primary Examiner* — Joseph J Lauture
(74) *Attorney, Agent, or Firm* — JCIPRNET (57) ABSTRACT

A digital-to-analog conversion device and a compensation circuit are provided. A digital-to-analog conversion device includes an R2R digital-to-analog converter and a compensation circuit. The R2R digital-to-analog converter is configured to receive a digital code with a plurality of bits and receive a reference voltage, and convert the digital code into an analog output signal according to the reference voltage. The compensation circuit is configured to receive the digital code, decode the digital code to generate a compensation code with a plurality of bits, and compensate the current value of the reference current according to the compensation code to generate a compensated reference current. The compensated reference current has a constant current value corresponding to different digital codes to make the reference voltage constant.

20 Claims, 5 Drawing Sheets

DIGITAL-TO-ANALOG CONVERSION DEVICE AND COMPENSATION CIRCUIT

CROSS-REFERENCE TO RELATED APPLICATION

This application claims the priority benefit of Taiwan application serial no. 108123601, filed on Jul. 4, 2019. The entirety of the above-mentioned patent application is hereby incorporated by reference herein and made a part of this specification.

BACKGROUND OF THE INVENTION

1. Field of the Invention

The present invention generally relates to a digital-to-analog conversion device and a compensation circuit, in particular, to a digital-to-analog conversion device having a constant reference voltage value, and a compensation circuit.

2. Description of Related Art

Figure 1:
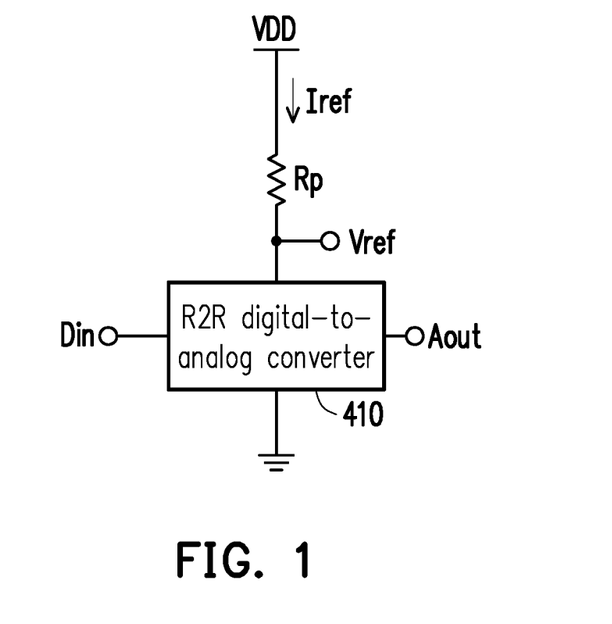
FIG. 1 is a schematic circuit diagram of a conventional R2R digital-to-analog converter.

Referring to FIG. 1, FIG. 1 is a schematic circuit diagram of a conventional R2R digital-to-analog converter. Generally, the existing R2R digital-to-analog converter (R2R DAC) 410 generates an analog output signal Aout corresponding to a digital code Din by using a reference voltage Vref and the digital code Din. For the R2R DAC 410 having a high resolution requirement, the reference voltage Vref is an important parameter that affects the performance of the R2R DAC 410. The reference voltage Vref is determined by a reference current Iref, a system power VDD and a wiring resistance Rp. However, the reference current Iref generates a fluctuation in current values according to the digital code Din. This fluctuation of the reference current Iref causes an unstable reference voltage Vref, and then reduces the resolution and performance such as signal plus noise and distortion (SINAD) and no spurious free dynamic range (SFDR) of the R2R DAC 410.

SUMMARY OF THE INVENTION

The present invention provides a digital-to-analog conversion device having a constant reference voltage, and a compensation circuit.

A digital-to-analog conversion device of the present invention comprises an R2R digital-to-analog converter and a compensation circuit. The R2R digital-to-analog converter is configured to receive a digital code with a plurality of bits and receive a reference voltage, and convert the digital code into an analog output signal according to the reference voltage. The reference voltage is generated according to a reference current. The reference current has a current value fluctuation corresponding to the digital code. The compensation circuit is coupled to the R2R digital-to-analog converter. The compensation circuit is configured to receive the digital code, decode the digital code according to the current value fluctuation to generate a compensation code with a plurality of bits, and compensate a current value of the reference current according to the compensation code to generate a compensated reference current. The compensated reference current has a constant current value corresponding to different digital codes.

A compensation circuit of the present invention is applicable to an R2R digital-to-analog converter. The R2R digital-to-analog converter is configured to receive a digital code with a plurality of bits and receive a reference voltage, and convert the digital code into an analog output signal according to the reference voltage. The reference voltage is generated according to a reference current. The reference current has a current value fluctuation corresponding to the digital code. The compensation circuit is configured to receive the digital code, and decode the digital code according to the current value fluctuation to generate a compensation code with a plurality of bits. The compensation circuit is configured to compensate a current value of the reference current according to the compensation code to generate a compensated reference current. The compensated reference current has a constant current value corresponding to different digital codes.

Based on the above, the digital-to-analog conversion device and the compensation circuit of the present invention decode the digital code according to the current value fluctuation, corresponding to the digital code, of the reference current to generate the compensation code, and compensate the current value of the reference current according to the compensation code to generate the compensated reference current. The reference current has the constant current value corresponding to different digital codes. In this way, the reference voltage has a constant voltage value.

In order to make the aforementioned and other objectives and advantages of the present invention comprehensible, embodiments accompanied with figures are described in detail below.

DESCRIPTION OF THE EMBODIMENTS

Figure 2:
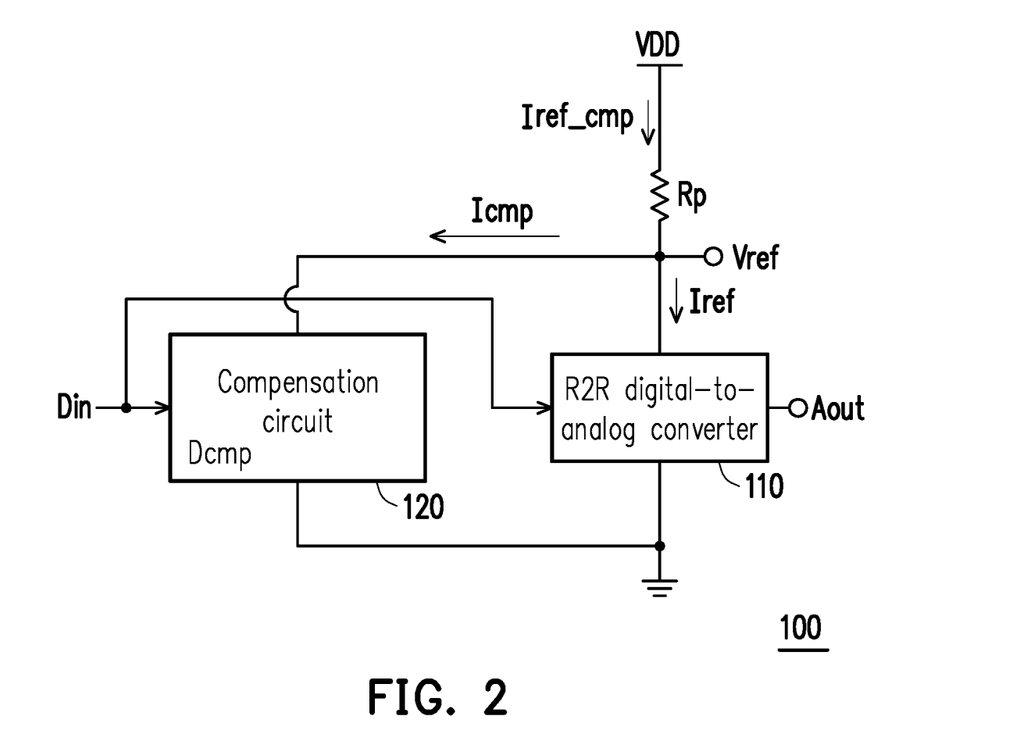
FIG. 2 is a schematic circuit diagram of a digital-to-analog conversion device according to a first embodiment of the present invention.

Referring to FIG. 2, FIG. 2 is a schematic circuit diagram of a digital-to-analog conversion device according to a first embodiment of the present invention. In the present embodiment, the digital-to-analog conversion device 100 includes an R2R digital-to-analog converter 110 and a compensation circuit 120. The R2R digital-to-analog converter 110 is configured to receive a digital code Din with a plurality of bits and receive a reference voltage Vref, and convert the digital code Din into an analog output signal Aout according to the reference voltage Vref. The R2R digital-to-analog converter 110 receives the reference voltage Vref via a reference voltage input terminal. The reference voltage Vref is generated according to a reference current Iref. For example, the reference current Iref flowing through a wiring resistance Rp generates a voltage drop. The reference voltage Vref is a difference between a system power VDD and the above voltage drop. The reference current Iref has a current value fluctuation corresponding to the digital code Din. The above current value fluctuation is obtained, for example, by the R2R digital-to-analog converter 110 in a manufacturing process or in a testing process, or by simulation. The compensation circuit 120 is coupled to the R2R digital-to-analog converter 110. The compensation circuit 120 is configured to receive the digital code Din, decode the digital code Din according to the current value fluctuation to generate a compensation code Dcmp with a plurality of bits, and compensate a current value of the reference current Iref according to the compensation code Dcmp to generate a compensated reference current Iref_cmp. For example, the compensation circuit 120 is coupled to the reference voltage input terminal. The compensation circuit 120 generates a compensation current Icmp according to the compensation code Dcmp. The digital-to-analog conversion device 100 adds up the compensation current Icmp and the reference current Iref to generate the compensated reference current Iref_cmp.

In this embodiment, the compensated reference current Iref_cmp has a constant current value corresponding to different digital codes Din. That is, the current value of the compensated reference current Iref_cmp does not change as the digital code Din changes.

In this embodiment, since the current value, corresponding to the different digital codes Din, of the compensated reference current Iref_cmp is constant, the voltage drop caused by the compensated reference current Iref_cmp flowing through the wiring resistance Rp is also constant. In this way, the R2R digital-to-analog converter 110 receives a constant reference voltage Vref. The R2R digital-to-analog converter receives the constant reference voltage, so as to improve the resolution and performance such as signal plus noise and distortion (SINAD) and spurious free dynamic range (SFDR) of the R2R digital-to-analog converter.

In this embodiment, the R2R digital-to-analog converter 110 and the compensation circuit 120 are connected to a reference ground terminal, and a potential of the reference ground terminal is used as a reference low voltage level. In some embodiments, the digital-to-analog conversion device 100 also includes a wiring reference resistor (not shown). A first end of the wiring reference resistor is coupled to the R2R digital-to-analog converter 110 and the compensation circuit 120. A second end of the wiring reference resistor is coupled to the reference ground terminal. The wiring reference resistor is configured to provide a reference low voltage level at the first end of the wiring reference resistor according to a resistance value of the wiring reference resistor. The R2R digital-to-analog converter 110 and the compensation circuit 120 receive the relatively stable reference low voltage level.

Figure 3:
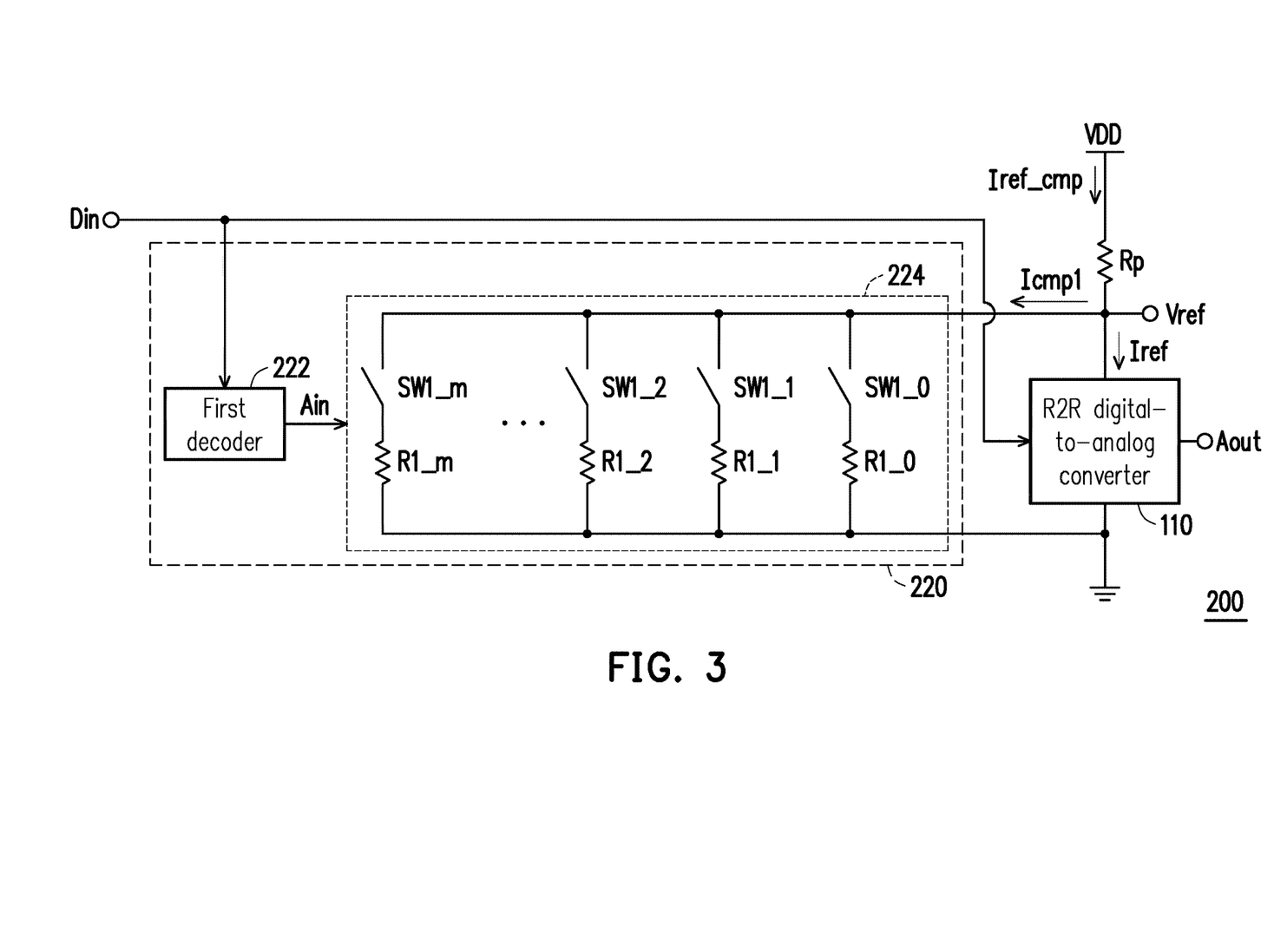
FIG. 3 is a schematic circuit diagram of a digital-to-analog conversion device according to a second embodiment of the present invention.
Figure 4:
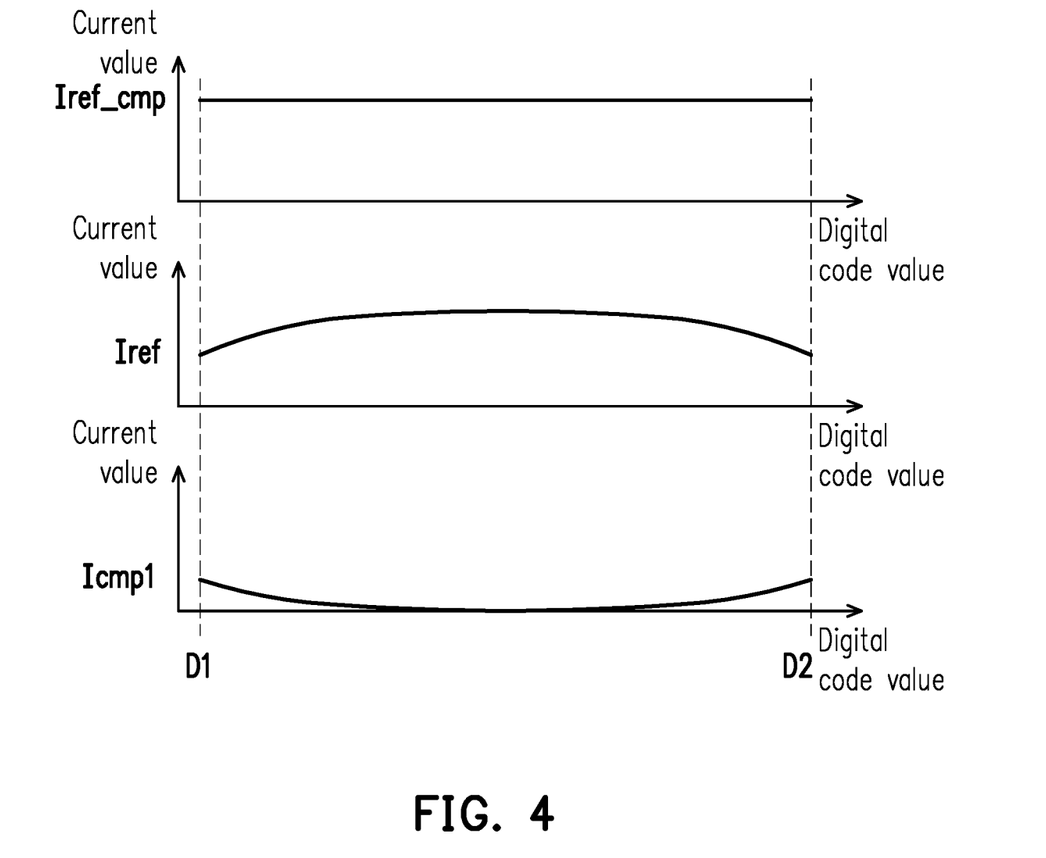
FIG. 4 is a schematic diagram of current values, corresponding to digital code values, of a reference current, a first compensation current and a compensated reference current illustrated according to one embodiment of the present invention.

Further, referring to FIGS. 3 and 4 at the same time, FIG. 3 is a schematic circuit diagram of a digital-to-analog conversion device according to a second embodiment of the present invention, and FIG. 4 is a schematic diagram of current values, corresponding to digital code values, of a reference current, a first compensation current and a compensated reference current illustrated according to one embodiment of the present invention. In this embodiment, a digital-to-analog conversion device 200 includes an R2R digital-to-analog converter 110 and a compensation circuit 220. The compensation circuit 220 includes a first decoder 222 and a first compensation current generator 224. The first decoder 222 is configured to receive a digital code Din and decode the digital code Din to generate a first compensation code Ain of a compensation code (such as the compensation code Dcmp of the first embodiment). The first compensation code Ain has a plurality of bits. The number of bits of the first compensation code Ain and the number of bits of the digital code Din are the same or different. In this embodiment, in the design of the first decoder 222, a gate stage of a desired logic gate is lower than Stage 6. As a result, the digital-to-analog conversion device 200 works under a high frequency (7.2 GHz or higher) condition. The first compensation current generator 224 is coupled to the first decoder 222 and a reference voltage input terminal. The first compensation current generator 224 is configured to receive the first compensation code Ain and generate a first compensation current Icmp1 corresponding to the digital code Din according to the first compensation code Ain.

In this embodiment, the reference current Iref has a first-stage current value fluctuation of the current value fluctuation in a digital code value range between a first digital code value D1 and a second digital code value D2 in a digital code value of the digital code Din. For example, in the above digital code value range, the current value of the reference current Iref increases, such as from 5.5 milliamperes to 7.5 milliamperes, as the digital code value increases. Next, the current value decreases, such as from 7.5 milliamperes to 5.5 milliamperes, as the digital code value increases. After the above first-stage current value fluctuation is obtained, the first decoder 222 and the first compensation current generator 224 are designed to provide a result of the current value of the first compensation current Icmp1 as shown in FIG. 4 according to the above first-stage current value fluctuation. The first compensation current Icmp1 is used to compensate the reference current Iref, so as to eliminate the first-stage current value fluctuation. Different designs of R2R digital-to-analog converters 110 have different first compensation codes Ain. The designs of the first decoder 222 and the first compensation current generator 224 are also different.

In this embodiment, the current value fluctuation of the first compensation current Icmp1 is designed to be in negative correlation with the first-stage current value fluctuation. In this way, the digital-to-analog conversion device 200 adds up the first compensation current Icmp1 and the reference current Iref to generate the compensated reference current Iref_cmp. The compensated reference current Iref_cmp has the same current value, such as 7.5 or 8 milliamperes, at different digital code values.

The way of generating the first compensation current Icmp1 is described in detail. In this embodiment, the first compensation current generator 224 includes m+1 first switches SW1_0 to SW1_m and m+1 first compensation resistors R1_0 to R1_m. First ends of the first switches SW1_0 to SW1_m are respectively coupled to the reference voltage input terminal. Control ends of the first switches SW1_0 to SW1_m are respectively coupled to the first decoder 222 to receive different bit codes of the first compensation code Ain. For example, the number of the first switches SW1_0 to SW1_m is equal to the number of bits of the first compensation code Ain. A control end of the first switch SW1_0 is configured to receive the 0th bit code of the first compensation code Ain. A control end of the first switch SW1_1 is configured to receive the first bit code of the first compensation code Ain. A control end of the first switch SW1_2 is configured to receive the second bit code of the first compensation code Ain. A control end of the first switch SW1_m is configured to receive the mth bit code of the first compensation code Ain. The present invention is not limited to this example.

First ends of the first compensation resistors R1_0 to R1_m are coupled to second ends of the first switches SW1_0 to SW1_m in a one-to-one manner. Second ends of the first compensation resistors R1_0 to R1_m are respectively coupled to the reference ground terminal. For example, a first end of the first compensation resistor R1_0 is coupled to a second end of the first switch SW1_0, a first end of the first compensation resistor R1_1 is coupled to a second end of the first switch SW1_1. A first end of the first compensation resistor R1_2 is coupled to a second end of the first switch SW1_2. A first end of the first compensation resistor R1_m is coupled to a second end of the first switch SW1_m.

In this embodiment, the first switches SW1_0 to SW1_m are implemented by at least one transistor switch. The first switches SW1_0 to SW1_m are respectively turned on or off according to the first compensation code Ain. The first compensation current generator 224 turns on or off the first switches SW1_0 to SW1_m according to the first compensation code Ain, and determines the number of parallel-connected first compensation resistors via the first switches that are turned on to provide a first compensation resistance value. The first compensation current generator 224 provides the first compensation current Icmp_1 according to the first compensation resistance value. The first compensation current Icmp_1 flows from the reference voltage input terminal through the first compensation current generator 224 and to the reference ground terminal. For example, in the digital code value range between the first digital code value D1 and the second digital code value D2, when the reference current Iref has a relatively low current value corresponding to a third digital code value, the first decoder 222 decodes the third digital code value to generate a first compensation code Ain for instructing the current value of the first compensation current Icmp1 to be increased. The first compensation current generator 224 increases the number of parallel-connected first compensation resistors according to the first compensation code Ain to provide the relatively low first compensation resistance value, so as to increase the current value of the first compensation current Icmp1. On the other hand, when the reference current Iref has a relatively low current value corresponding to a fourth digital code value, the first decoder 222 decodes the fourth digital code value to generate a first compensation code Ain for instructing the current value of the first compensation current Icmp1 to be decreased. The first compensation current generator 224 decreases the number of parallel-connected first compensation resistors according to the first compensation code Ain to provide a relatively high first compensation resistance value, so as to decrease the current value of the first compensation current Icmp1.

Figure 5:
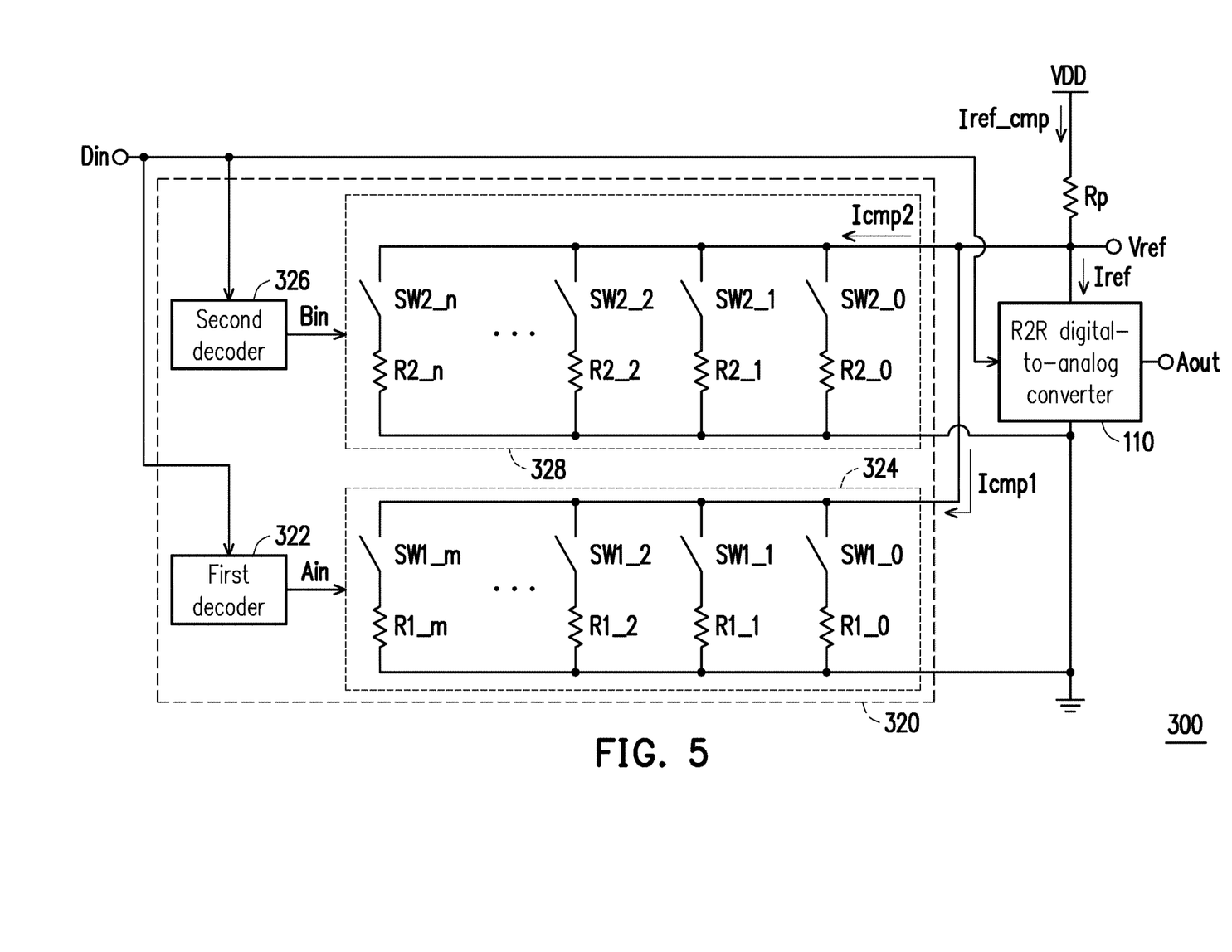
FIG. 5 is a schematic circuit diagram of a digital-to-analog conversion device according to a third embodiment of the present invention.
Figure 6:
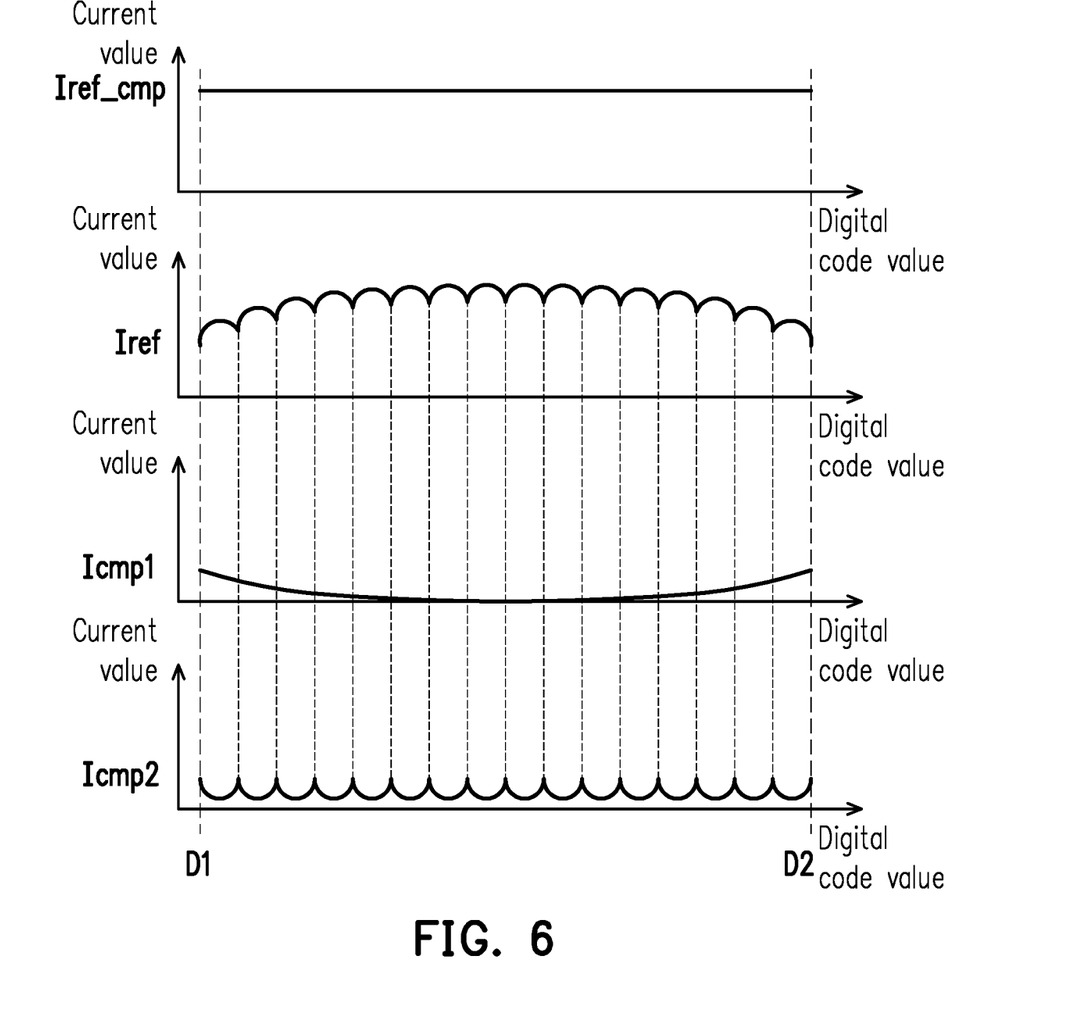
FIG. 6 is a schematic diagram of current values, corresponding to digital code values, of a reference current, a first compensation current, a second compensation current and a compensated reference current illustrated according to one embodiment of the present invention.

Referring to FIGS. 5 and 6 at the same time, FIG. 5 is a schematic circuit diagram of a digital-to-analog conversion device according to a third embodiment of the present invention, and FIG. 6 is a schematic diagram of current values, corresponding to digital code values, of a reference current, a first compensation current, a second compensation current and a compensated reference current illustrated according to one embodiment of the present invention. In this embodiment, a digital-to-analog conversion device 300 includes an R2R digital-to-analog converter 110 and a compensation circuit 320. The compensation circuit 320 includes a first decoder 322, a first compensation current generator 324, a second decoder 326 and a second compensation current generator 328. The implementation details of the first decoder 322 and the first compensation current generator 324 and the way of generating a first compensation current Icmp1 are sufficiently found in the implementation of the second embodiment, and thus the descriptions thereof are omitted herein. In this embodiment, the first-stage current value fluctuation of the reference current Iref includes a plurality of second-stage current value fluctuation packs. The generation of the plurality of second-stage current value fluctuation packs is because the design of the R2R digital-to-analog converter 110 is changed. For example, a thermometer-coded circuit is added in the R2R digital-to-analog converter 110. Therefore, compared with the second embodiment, this embodiment adds the second decoder 326 and the second compensation current generator 328 in order to eliminate the second-stage current value fluctuation packs.

The above first-stage current value fluctuation and the second-stage current value fluctuation packs are obtained, for example, by the R2R digital-to-analog converter 110 in a manufacturing process or a testing process, or by simulation. After the above first-stage current value fluctuation and second-stage current value fluctuation packs are obtained, the first decoder 322, the first compensation current generator 324, the second decoder 326 and the second compensation current generator 328 are designed according to the above first-stage current value fluctuation and second-stage current value fluctuation packs to provide a result of the current value of a first compensation current Icmp1 and a result of the current value of a second compensation current Icmp2 as shown in FIG. 6.

In this embodiment, the second decoder 326 is configured to receive a digital code Din and decode the digital code Din to generate a second compensation code Bin of the compensation code (such as the compensation code Dcmp of the first embodiment). The second compensation code Bin has a plurality of bits. In this embodiment, in the design of the second decoder 326, a gate stage of a desired logical gate is lower than Stage 6. As a result, the digital-to-analog conversion device 300 works under a high frequency (7.2 GHz or higher) condition. The second compensation current generator 328 is coupled to the second decoder 326 and the reference voltage input terminal. The second compensation current generator 328 is configured to receive the second compensation code Bin and generate the second compensation current Icmp2 corresponding to the digital code Din according to the second compensation code Bin. The second compensation current Icmp2 is used to eliminate the second-stage current value fluctuation packs.

In this embodiment, the current value fluctuation of the second compensation current Icmp2 is designed to be in negative correlation with the second-stage current value fluctuation packs. Therefore, the digital-to-analog conversion device 300 adds up the second compensation current Icmp2 and the reference current Iref as shown in FIG. 6 to eliminate the second-stage current value fluctuation packs. After the second-stage current value fluctuation packs of the reference current Iref are eliminated, the result of the current value, corresponding to the digital code value, of the reference current Iref is equal or similar to the result of the current value, corresponding to the digital code value, of the reference current Iref as shown in FIG. 4. That is, the digital-to-analog conversion device 300 adds up the first compensation current Icmp_1, the second compensation current Icmp2 and the reference current Iref as shown in FIG. 6 to generate the compensated reference current Iref_cmp. In this embodiment, different designs of R2R digital-to-analog converters 110 have different first compensation codes Ain and different second compensation codes Bin. The designs of the first decoder 322, the first compensation current generator 324, the second decoder 326 and the second compensation current generator 328 are also different.

The way of generating the second compensation current Icmp2 is described in detail. In this embodiment, the second compensation current generator 328 includes n+1 second switches SW2_0 to SW2_$n$ and n+1 second compensation resistors R2_0 to R2_$n$. First ends of the second switches SW2_0 to SW2_$n$ are respectively coupled to the reference voltage input terminal. Control ends of the second switches SW2_0 to SW2_$n$ are respectively coupled to the second decoder 326 to receive different bit codes of the second compensation code Bin. For example, the number of the second switches SW2_0 to SW2_$n$ is equal to the number of bits of the second compensation code Bin. A control end of the second switch SW2_0 is configured to receive the 0th bit code of the second compensation code Bin. A control end of the second switch SW2_1 is configured to receive the first bit code of the second compensation code Bin. A control end of the second switch SW2_2 is configured to receive the second bit code of the second compensation code Bin. A control end of the second switch SW2_$n$ is configured to receive the nth bit code of the second compensation code Bin. The present invention is not limited to this example.

First ends of the second compensation resistors R2_0 to R2_$n$ are coupled to second ends of the second switches SW2_0 to SW2_$n$ in a one-to-one manner. Second ends of the second compensation resistors R2_0 to R2_$n$ are respectively coupled to the reference ground terminal. For example, a first end of the second compensation resistor R2_0 is coupled to a second end of the second switch SW2_0. A first end of the second compensation resistor R2_1 is coupled to a second end of the second switch SW2_1. A first end of the second compensation resistor R2_2 is coupled to a second end of the second switch SW2_2. A first end of the second compensation resistor R2_$n$ is coupled to a second end of the second switch SW2_$n$.

In this embodiment, the second switches SW2_0 to SW2_$n$ are implemented by at least one transistor switch. The second switches SW2_0 to SW2_$n$ are respectively turned on or off according to the second compensation code Bin. The second compensation current generator 328 turns on or off the second switches SW2_0 to SW2_$n$ according to the second compensation code Bin, and determines the number of parallel-connected second compensation resistors via the second switches that are turned on to provide the second compensation resistance value. The second compensation current generator 328 provides the second compensation current Icmp2 according to the second compensation resistance value. The second compensation current Icmp2 flows from the reference voltage input terminal through the second compensation current generator 328 and to the reference ground terminal.

In some embodiments, the first decoder 322 and the second decoder 326 are integrated into one decoding circuit. That is, the above decoding circuit decodes the digital code Din to generate the first compensation code Ain and the second compensation code Bin.

Based on the above, the digital-to-analog conversion device and the compensation circuit of the present invention decode the digital code according to the current value fluctuation, corresponding to the digital code, of the reference current to generate the compensation code, and compensate the current value of the reference current according to the compensation code to generate the compensated reference current. Therefore, the reference current has the constant current value corresponding to different digital codes. In this way, the R2R digital-to-analog converter receives a constant reference voltage, so as to improve the resolution and performance such as SINAD and SFDR of the R2R digital-to-analog converter.

Although the present invention has disclosed the above embodiments, but the embodiments are not intended to limit the present invention. Any one of ordinary skill in the art can make some changes and refinements without departing from the spirit or scope of the present invention. Therefore, the protection scope of the present invention shall be defined by the scope of the appended claims.

What is claimed is:
1. A digital-to-analog conversion device, comprising:
an R2R digital-to-analog converter, configured to receive a digital code with a plurality of bits and receive a reference voltage, and convert the digital code into an analog output signal according to the reference voltage, wherein the reference voltage is generated according to a reference current, and the reference current comprises a current value fluctuation corresponding to the digital code; and
a compensation circuit, coupled to the R2R digital-to-analog converter and configured to receive the digital code, decode the digital code according to the current value fluctuation to generate a compensation code with a plurality of bits, and compensate a current value of the reference current according to the compensation code to generate a compensated reference current, wherein the compensated reference current comprises a constant current value corresponding to different digital codes.

2. The digital-to-analog conversion device according to claim 1, wherein the reference current comprises a first-stage current value fluctuation of the current value fluctuation in a digital code value range between a first digital code value and a second digital code value of a digital code value of the digital code, the R2R digital-to-analog converter receives the reference voltage via a reference voltage input terminal, the compensation circuit comprises:
a first decoder, configured to receive the digital code and decode the digital code to generate a first compensation code of the compensation code, wherein the first compensation code comprises a plurality of bits; and
a first compensation current generator, coupled to the first decoder and the reference voltage input terminal and configured to receive the first compensation code and generate a first compensation current corresponding to the digital code according to the first compensation code,
wherein the first compensation current is used to compensate the reference current, so as to eliminate the first-stage current value fluctuation.

3. The digital-to-analog conversion device according to claim 2, wherein the first compensation current generator comprises:
a plurality of first switches, wherein first ends of the plurality of first switches are respectively coupled to the reference voltage input terminal, and control ends of the plurality of first switches are respectively coupled to the first decoder to receive different bit codes of the first compensation code; and a plurality of first compensation resistors, wherein first ends of the plurality of first compensation resistors are coupled to second ends of the plurality of first switches in a one-to-one manner, and second ends of the plurality of first compensation resistors are respectively coupled to a reference ground terminal.

4. The digital-to-analog conversion device according to claim 3, wherein the first compensation current generator turns on or off the plurality of first switches according to the first compensation code, determines the number of parallel-connected first compensation resistors via the plurality of first switches that are turned on to provide a first compensation resistance value, and provides the first compensation current according to the first compensation resistance value.

5. The digital-to-analog conversion device according to claim 2, wherein the current value fluctuation of the first compensation current is designed to be in negative correlation with the first-stage current value fluctuation.

6. The digital-to-analog conversion device according to claim 2, wherein the digital-to-analog conversion device adds up the first compensation current and the reference current to generate the compensated reference current.

7. The digital-to-analog conversion device according to claim 2, wherein the first-stage current value fluctuation of the reference current comprises a plurality of second-stage current value fluctuation packs, and the compensation circuit also comprises:
a second decoder, configured to receive the digital code and decode the digital code to generate a second compensation code of the compensation code, wherein the second compensation code comprises a plurality of bits; and
a second compensation current generator, coupled to the second decoder and the reference voltage input terminal and configured to receive the second compensation code and generate a second compensation current corresponding to the digital code according to the second compensation code,
wherein the second compensation current is used to eliminate the second-stage current value fluctuation packs.

8. The digital-to-analog conversion device according to claim 7, wherein the second compensation current generator comprises:
a plurality of second switches, wherein first ends of the plurality of second switches are respectively coupled to the reference voltage input terminal, and control ends of the plurality of second switches are respectively coupled to the second decoder to receive different bit codes of the second compensation code; and
a plurality of second compensation resistors, wherein first ends of the plurality of second compensation resistors are coupled to second ends of the plurality of second switches in a one-to-one manner, and second ends of the plurality of second compensation resistors are respectively coupled to a reference ground terminal.

9. The digital-to-analog conversion device according to claim 8, wherein the second compensation current generator turns on or off the plurality of second switches according to the second compensation code, determines the number of parallel-connected second compensation resistors via the plurality of second switches that are turned on to provide a second compensation resistance value, and provides the second compensation current according to the second compensation resistance value.

10. The digital-to-analog conversion device according to claim 7, wherein the digital-to-analog conversion device adds up the first compensation current, the second compensation current and the reference current to generate the compensated reference current.

11. The digital-to-analog conversion device according to claim 1, further comprising:
a wiring reference resistor, wherein a first end of the wiring reference resistor is coupled to the R2R digital-to-analog converter and the compensation circuit, a second end of the wiring reference resistor is coupled to a reference ground terminal and configured to provide a reference low voltage level at the first end of the wiring reference resistor according to the resistance value of the wiring reference resistor.

12. A compensation circuit, applicable to an R2R digital-to-analog converter, wherein the R2R digital-to-analog converter is configured to receive a digital code with a plurality of bits and receive a reference voltage, and convert the digital code into an analog output signal according to the reference voltage, the reference voltage is generated according to a reference current, and the reference current comprises a current value fluctuation corresponding to the digital code, and the compensation circuit is configured to:
receive the digital code, decode the digital code according to the current value fluctuation to generate a compensation code with a plurality of bits, and
compensate a current value of the reference current according to the compensation code to generate a compensated reference current;
the compensated reference current comprises a constant current value corresponding to different digital codes.

13. The compensation circuit according to claim 12, wherein the reference current comprises a first-stage current value fluctuation of the current value fluctuation in a digital code value range between a first digital code value and a second digital code value of a digital code value of the digital code, the R2R digital-to-analog converter receives the reference voltage via a reference voltage input terminal, the compensation circuit comprises:
a first decoder, configured to receive the digital code and decode the digital code to generate a first compensation code of the compensation code, wherein the first compensation code comprises a plurality of bits; and
a first compensation current generator, coupled to the first decoder and the reference voltage input terminal and configured to receive the first compensation code and generate a first compensation current corresponding to the digital code according to the first compensation code,
wherein the first compensation current is used to compensate the reference current, so as to eliminate the first-stage current value fluctuation.

14. The compensation circuit according to claim 13, wherein the first compensation current generator comprises:
a plurality of first switches, wherein first ends of the plurality of first switches are respectively coupled to the reference voltage input terminal, and control ends of the plurality of first switches are respectively coupled to the first decoder to receive different bit codes of the first compensation code; and
a plurality of first compensation resistors, wherein first ends of the plurality of first compensation resistors are coupled to second ends of the plurality of first switches in a one-to-one manner, and second ends of the plurality of first compensation resistors are respectively coupled to a reference ground terminal.

15. The compensation circuit according to claim 14, wherein the first compensation current generator turns on or off the plurality of first switches according to the first compensation code, determines the number of parallel-connected first compensation resistors via the plurality of first switches that are turned on to provide a first compensation resistance value, and provides the first compensation current according to the first compensation resistance value.

16. The compensation circuit according to claim 13, wherein the current value fluctuation of the first compensation current is designed to be in negative correlation with the first-stage current value fluctuation.

17. The compensation circuit according to claim 13, wherein the first-stage current value fluctuation of the reference current comprises a plurality of second-stage current value fluctuation packs, and the compensation circuit also comprises:
   a second decoder, configured to receive the digital code and decode the digital code to generate a second compensation code of the compensation code, wherein the second compensation code comprises a plurality of bits; and
   a second compensation current generator, coupled to the second decoder and the reference voltage input terminal and configured to receive the second compensation code and generate a second compensation current corresponding to the digital code according to the second compensation code,
   wherein the second compensation current is used to eliminate the second-stage current value fluctuation packs.

18. The compensation circuit according to claim 17, wherein the second compensation current generator comprises:
   a plurality of second switches, wherein first ends of the plurality of second switches are respectively coupled to the reference voltage input terminal, and control ends of the plurality of second switches are respectively coupled to the second decoder to receive different bit codes of the second compensation code; and
   a plurality of second compensation resistors, wherein first ends of the plurality of second compensation resistors are coupled to second ends of the plurality of second switches in a one-to-one manner, and second ends of the plurality of second compensation resistors are respectively coupled to a reference ground terminal.

19. The compensation circuit according to claim 18, wherein the second compensation current generator turns on or off the plurality of second switches according to the second compensation code, determines the number of parallel-connected second compensation resistors via the plurality of second switches that are turned on to provide a second compensation resistance value, and provides the second compensation current according to the second compensation resistance value.

20. The compensation circuit according to claim 12, further comprising:
   a wiring reference resistor, wherein a first end of the wiring reference resistor is coupled to the R2R digital-to-analog converter and the compensation circuit, a second end of the wiring reference resistor is coupled to a reference ground terminal and configured to provide a reference low voltage level at the first end of the wiring reference resistor according to the resistance value of the wiring reference resistor.

\* \* \* \* \*